(12) United States Patent
Ferguson et al.

(10) Patent No.: US 8,305,144 B1
(45) Date of Patent: Nov. 6, 2012

(54) CIRCUITS AND METHODS FOR CONTROLLING QUIESCENT CURRENT IN AMPLIFIERS

(75) Inventors: Paul Ferguson, Riverton, UT (US); Daniel M. Joffe, Owens Crossroads, AL (US)

(73) Assignee: ADTRAN, Inc., Huntsville, AL (US)

( * ) Notice: Subject to any disclaimer, the term of this patent is extended or adjusted under 35 U.S.C. 154(b) by 0 days.

(21) Appl. No.: 12/942,573

(22) Filed: Nov. 9, 2010

(51) Int. Cl.
*H03F 3/45* (2006.01)
(52) U.S. Cl. ......................................... 330/257; 330/254
(58) Field of Classification Search ............... 330/51, 330/252–261, 9
See application file for complete search history.

(56) References Cited

U.S. PATENT DOCUMENTS

| | | | |
|---|---|---|---|
| 4,857,861 A | 8/1989 | Seevinck et al. | |
| 5,428,316 A | 6/1995 | Molnar | |
| 5,689,211 A | 11/1997 | Embree | |
| 6,281,751 B1 | 8/2001 | Maulik | |
| 6,556,081 B2 | 4/2003 | Muza | |
| 6,603,356 B1 | 8/2003 | Kim et al. | |
| 6,825,721 B2 | 11/2004 | Sanchez et al. | |
| 7,262,664 B1 | 8/2007 | Joffe et al. | |
| 7,986,188 B2 * | 7/2011 | Fujiwara | 330/292 |

OTHER PUBLICATIONS

You, et al., "Low-Voltage Class AB Buffers with Quiescent Current Council," Department of Electrical Engineering, Texas A&M University, Oct. 27, 1997.

* cited by examiner

*Primary Examiner* — Hieu Nguyen
(74) *Attorney, Agent, or Firm* — Maynard Cooper & Gale, P.C.; Jon E. Holland

(57) ABSTRACT

A power amplifier provides relatively stable quiescent current while maintaining relatively high signal gains and peak to quiescent current ratios. The power amplifier has an input stage and a current mirror stage and incorporates a control transistor between these stages. The control transistor transitions to the triode mode for small inputs and offset voltages thereby reducing the amplifier circuit's gain. However, the control transistor transitions from the triode region to saturation as the input signal becomes larger thereby allowing the amplifier circuit to maintain a relatively high gain for large inputs. Accordingly, better quiescent current characteristics can be obtained without significantly sacrificing performance.

16 Claims, 4 Drawing Sheets

CIRCUITS AND METHODS FOR CONTROLLING QUIESCENT CURRENT IN AMPLIFIERS

RELATED ART

A complementary metal-oxide semiconductor (CMOS) amplifier is a well known device used to provide a voltage or current gain to an input signal. The current used by an amplifier typically has two components, a signal current component and a quiescent current component. The signal current component is generated in response to the amplified input signal. The quiescent current component refers to the current that is used by the amplifier irrespective of whether the amplifier is receiving an input signal. When the amplifier is in a quiescent state or, in other words, the input signal is near zero, the signal current component goes to near zero, and the total current used by the amplifier is, therefore, largely quiescent current. Thus, an amplifier's quiescent current can be measured by simply taking a measurement of the total current of the amplifier while it is in a quiescent (no-signal) state.

The quiescent current used by an amplifier can have a significant effect on the amplifier's performance. In this regard, a high quiescent current wastes power and reduces the amplifier's efficiency. Reducing quiescent current, therefore, can improve efficiency and conserve power, but setting the quiescent current too low can increase the effects of crossover distortion. Further, if the quiescent current turns completely off, the amplifier can become unstable and unpredictable. Moreover, balancing the tradeoffs between low distortion and low quiescent current is a critical aspect of an amplifier design.

Further, one measure of amplifier performance is the ratio of peak current to quiescent current, and having a low quiescent current generally improves such a ratio. For most amplifiers, a small but stable quiescent current is highly desirable. Unfortunately, transistor mismatches within the amplifier can drastically affect the quiescent current. In this regard, transistor mismatches can create an offset voltage at the input stage of an amplifier, and this offset voltage is magnified by the amplifier's gain such that small random changes in this offset voltage result in large current fluctuations at the amplifier's output stage.

To compensate for the effects of the offset voltage, the gain of the amplifier can be reduced to keep the output current fluctuations within a desired range. However, lowering the gain of the amplifier reduces its performance. In particular, lowering amplifier gain typically decreases the peak available output current and can increase distortion.

It is possible to also compensate for the effects of the offset voltage by increasing quiescent current such that the random variation in output current caused by fluctuations in the offset voltage is a small percentage of the quiescent current. However, as described above, increasing quiescent current undesirably degrades efficiency.

Moreover, better amplifier circuits for reducing the effects of the offset voltage without significantly sacrificing performance are generally desirable.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure relates to amplifiers that provide relatively stable quiescent current while maintaining relatively high signal gains and peak to quiescent current ratios. An amplifier circuit in accordance with at least one embodiment of the present disclosure has an input stage and a current mirror stage and incorporates a control transistor between these stages. The control transistor transitions to triode mode for small inputs and offset voltages thereby reducing the amplifier circuit's gain. However, the control transistor transitions from the triode region to saturation as the input signal becomes larger thereby allowing the amplifier circuit to maintain a relatively high gain for large inputs. Accordingly, better quiescent current characteristics can be obtained without significantly sacrificing performance.

Figure 1:
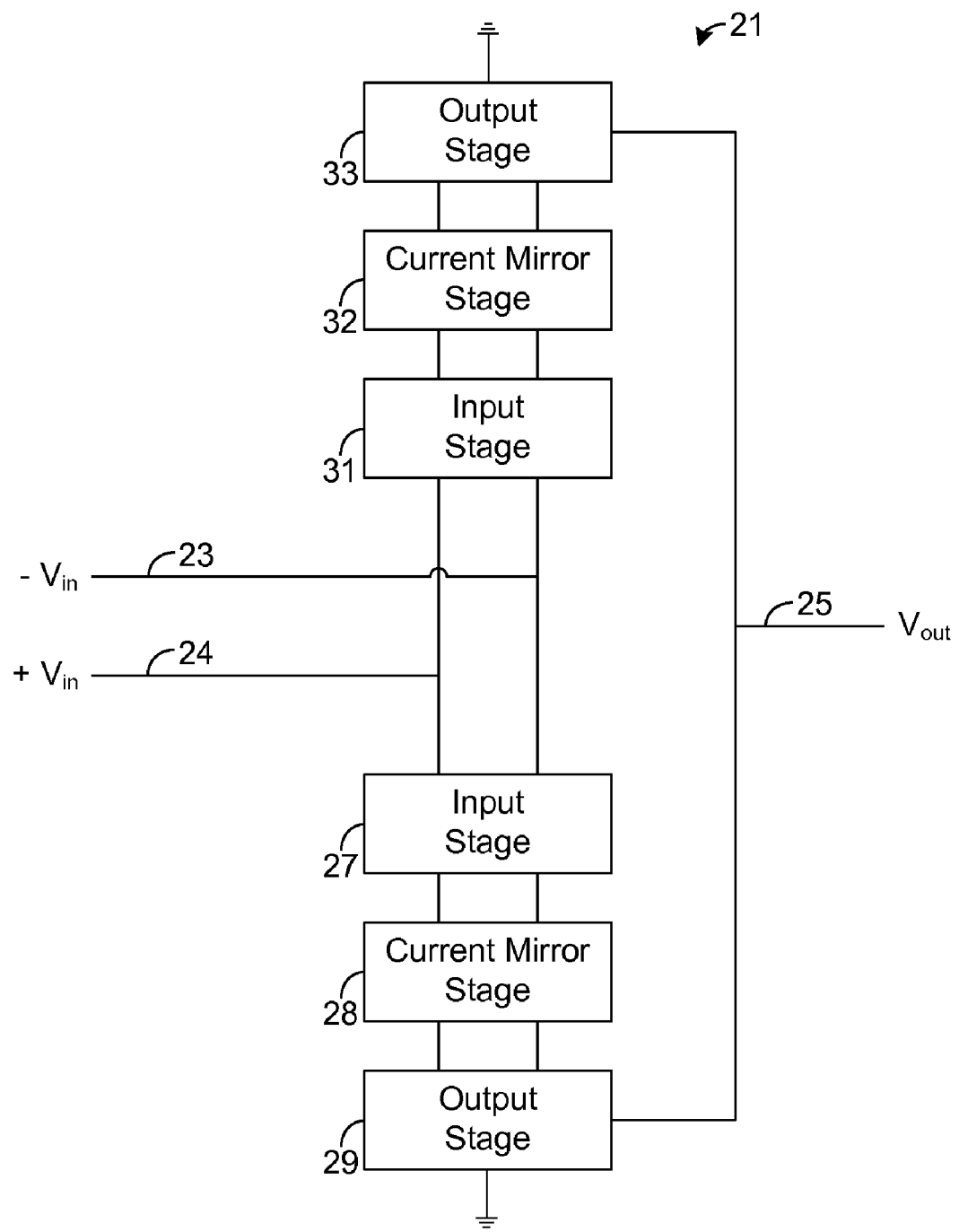
FIG. 1 is a block diagram illustrating a conventional power amplifier.

FIG. 1 depicts a circuit 21 for a conventional complimentary metal-oxide semiconductor (CMOS) power amplifier. As shown by FIG. 1, the circuit 21 has two input connections 23 and 24 for receiving a differential voltage input, negative (−) $V_{in}$ and positive (+) $V_{in}$. The circuit 21 also has an output connection 25 for providing an output voltage ($V_{out}$). The circuit 21 amplifies the differential input voltage such that the output voltage has a significant gain relative to the differential input voltage.

As further shown by FIG. 1, the amplifier circuit 21 has an input stage 27, a current mirror stage 28, and an output stage 29. The stages 27-29 sink output current. To source output current, the amplifier circuit 21 has an input stage 31, a current mirror stage 32, and an output stage 33, which essentially mirror stages 27-29, as will be described in more detail hereafter.

Figure 2:
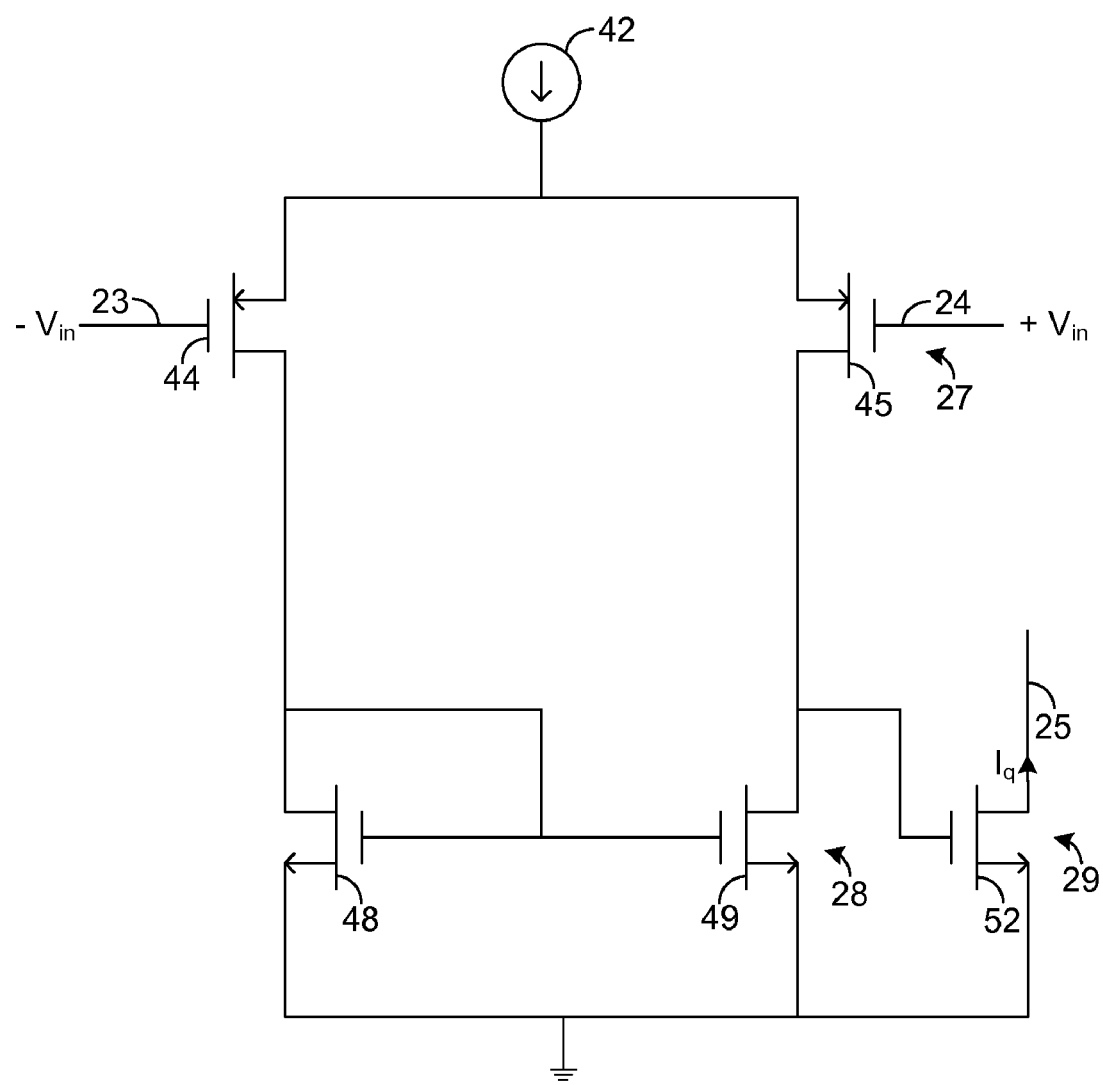
FIG. 2 is a circuit diagram illustrating a portion of the conventional power amplifier of FIG. 1.

FIG. 2 depicts a more detailed view of the stages 27-29 that amplify positive input signals. As shown by FIG. 2, a current source 42 supplies bias current to input stage 27. The input stage 27 comprises a pair of p-type transistors 44 and 45, collectively referred to as a "differential input pair," that receive input signals for amplification by the circuit 21. The current mirror stage 28 comprises a pair of n-type transistors 48 and 49, and the output stage 29 comprises an n-type transistor 52. Stage 28 is a "current mirror" in that the same amount of current ideally flows through each of the transistors 48 and 49. The output stage 29 outputs amplified signals from the circuit 21. The configuration of the stages 31-33 (FIG. 1) is essentially the same as the configuration of the stages 27-29 except that the transistors (not shown) of the input stage 31 are n-type and the transistors (not shown) of the current mirror stage 32 and the output stage 33 are p-type.

Ideally, the differential input transistors 44 and 45 are of the same size, and there is no mismatch between these transistors 44 and 45. Thus, the same amount of current flows through both transistors 44 and 45. In addition, the voltages of the gates of the current mirror transistors 48 and 49 are the same, and the same current ideally flows through both transistors 48 and 49. Thus, the current through the output transistor 52 will be according to the ratio of the sizes of transistors 49 and 52.

For example, if output transistor 52 is one-hundred (100) times larger than current mirror transistor 49, then the current through the transistor 52 will ideally be one-hundred (100) times larger than the current through transistor 49.

However, imperfections in manufacturing the differential input transistors 44 and 45 typically create a threshold voltage mismatch between these transistors 44 and 45 such that there is a small voltage difference, referred to as the "offset voltage," between the gate of transistor 44 and the gate of transistor 45. Thus, less current flows through one of the transistors 44 and 45. For example, assume that due to the mismatch between the differential input transistors 44 and 45, more current flows through transistor 45 as compared to transistor 44. Since transistors 48 and 49 are usually closely matched and there is less current passing through transistor 48, there is less current pulled down by transistor 49 as compared to the ideal case described above with no mismatch between transistors 44 and 45. Therefore, the voltage of the gate of transistor 52 is higher than in the ideal case.

Noting that the output stage 29 is a high gain stage, even small increases in the voltage of the gate of transistor 52 result in significant increases in the current output by the output transistor 52. Thus, a relatively small mismatch between the differential pair transistors 44 and 45 undesirably results in a relatively large increase in the quiescent current output from the transistor 52. Further, small fluctuations in the output offset voltage result in large fluctuations in the output quiescent current ($I_q$) thereby undesirably decreasing the stability of the output quiescent current.

Figure 3:
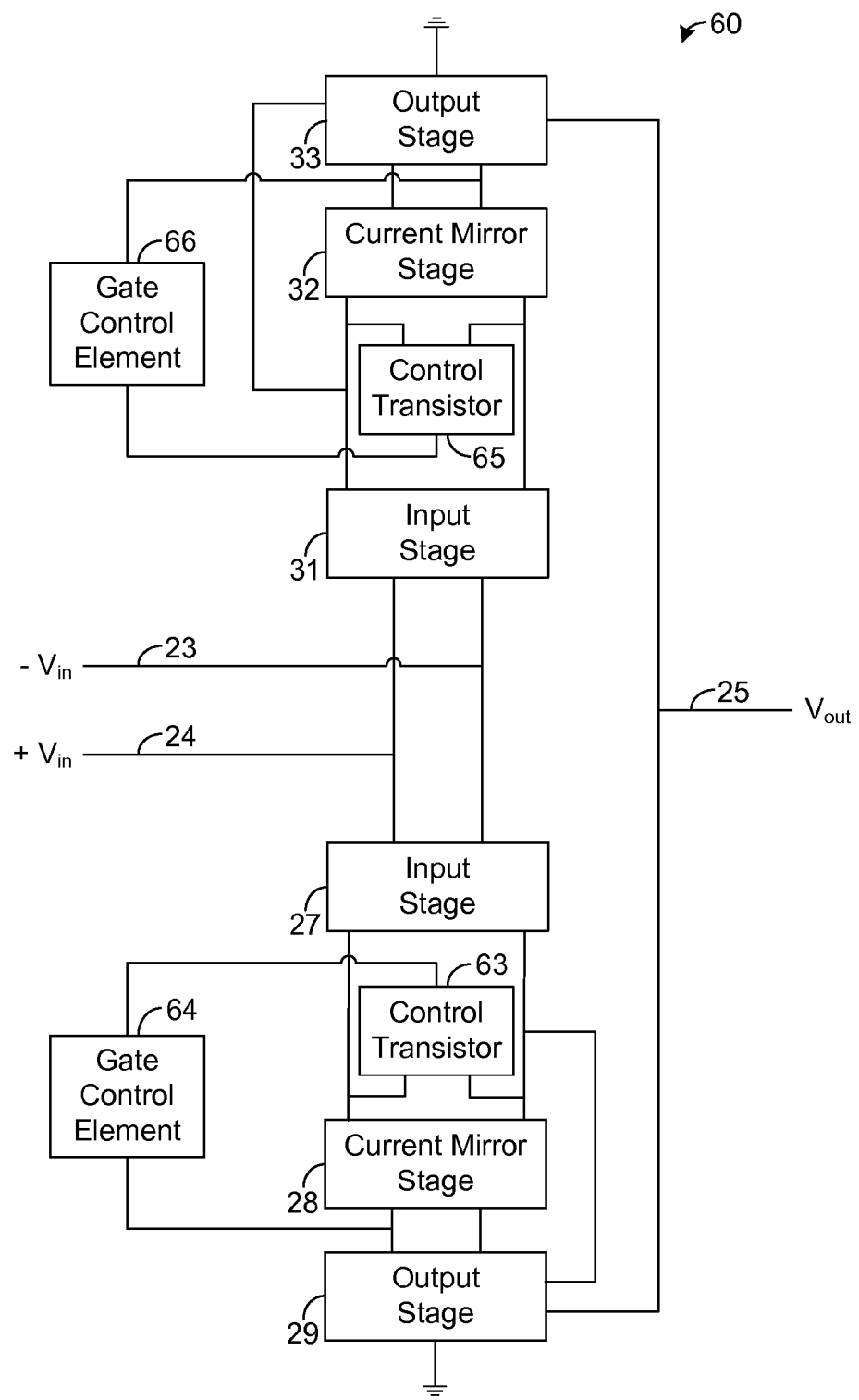
FIG. 3 is a block diagram illustrating a power amplifier in accordance with an exemplary embodiment of the present disclosure.

FIG. 3 depicts a circuit 60 for a CMOS power amplifier in accordance with an exemplary embodiment of the present disclosure. As can be seen by comparing FIG. 3 to FIG. 1, the amplifier circuit 60 may be similar to the conventional amplifier circuit 21 except as otherwise described herein. In this regard, the circuit 60 comprises a control transistor 63 between the input stage 27 and the current mirror stage 28 and a control transistor 65 between the input stage 31 and the current mirror stage 32. The control transistor 63 is coupled to a gate control element 64 that controls a voltage of the gate of the control transistor 63, as will be described in more detail hereafter, and the control transistor 65 is similarly coupled to a gate control element 66.

Note that the operation and configuration of the control transistor 63 and gate control element 64 within the stages 27-29 for amplifying positive input signals is similar to the operation and configuration of the control transistor 65 and gate control element 66 within the stages 31-33 for amplifying negative input signals. Thus, for brevity purposes, exemplary operations and configurations of the control transistor 63, gate control element 64, and stages 27-29 will be described hereafter in detail with less emphasis on the possible operations and configurations of the control transistor 65, gate control element 66, and stages 31-33. However, it is to be understood that teachings relating to the control transistor 63, gate control element 64, and stages 27-29 may similarly be applied to the control transistor 65, gate control element 66, and the stages 31-33.

Note that commonly-assigned U.S. Pat. No. 7,262,664, entitled "Circuit and Method for Controlling Quiescent Current of an Amplifier" and issued on Aug. 28, 2007, which is incorporated herein by reference, describes power amplifiers that utilize a transconductance amplifier between an input stage and a current mirror stage in order to reduce gain for small inputs and offset voltages but allow a relatively high gain for large inputs. However, the circuits described herein that use control transistors 63 and 65 generally utilize less current and can be manufactured smaller relative to comparable circuits described in U.S. Pat. No. 7,262,664.

Figure 4:
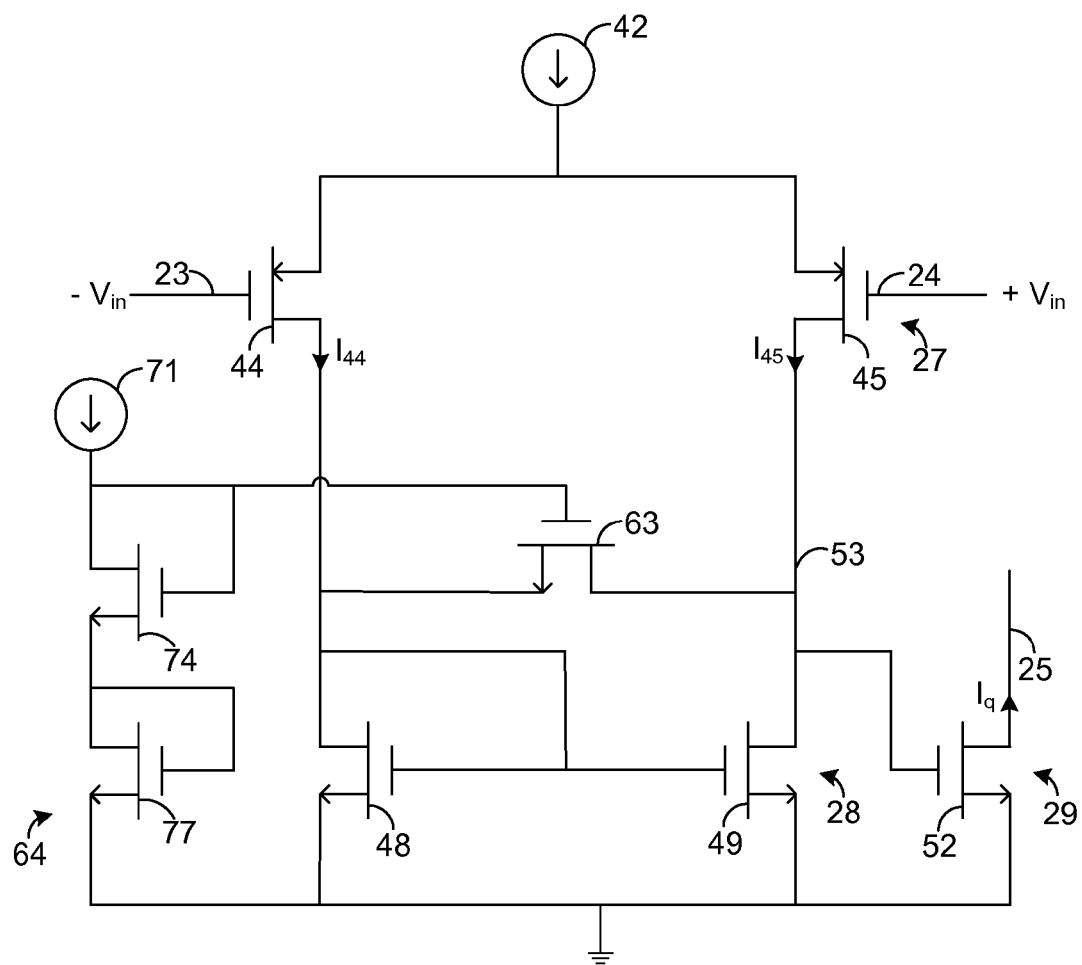
FIG. 4 is a circuit diagram illustrating an exemplary embodiment of a portion of the power amplifier depicted in FIG. 3.

FIG. 4 depicts an exemplary embodiment of the stages 27-29, the control transistor 63, and the gate control element 64 of the amplifier circuit 60 depicted in FIG. 3. As shown by FIG. 4, the current source 42 is coupled to the sources of the differential input transistors 44 and 45. The input connection 23 providing $-V_{in}$ is coupled to the gate of the differential input transistor 44, and the input connection 24 providing $+V_{in}$ is coupled to the gate of differential input transistor 45. In addition, the drain of the differential input transistor 44 is coupled to the drain and gate of the current mirror transistor 48. The drain of the differential input transistor 44 is also coupled to the source of the control transistor 63, as well as to the gate of the current mirror transistor 49. The drain of the differential input transistor 45 is coupled to the drain of the control transistor 63 and to the drain of the current mirror transistor 49. The drain of the differential input transistor 45 is also coupled to the gate of the output transistor 52. In addition, the sources of the current mirror transistors 48 and 49, as well as the output transistor 52, are all coupled to ground.

The gate control element 64 comprises a current source 71, which is coupled to the drain and gate of a transistor 74. The gate of the control transistor 63 is coupled to the current source 71, as well as the drain and gate of the transistor 74. Further, the source of the transistor 74 is coupled to the drain and gate of a transistor 77, and the source of the transistor 77 is coupled to the sources of the current mirror transistors 48 and 49, as well as the source of the output transistor 52.

Assume that the transistors 48, 74, and 77 are all the same size as the control transistor 63 and that the current provided by the current source 42 is twice the current provided by the current source 71. In such case, the current from the current source 42 splits equally between the differential input transistors 44 and 45, and also between the current mirror transistors 48 and 49. The current through the transistor 77 of the gate control element 64 is equal to the current through the current mirror transistor 48, and the corresponding gate voltages of the transistors 48 and 77 are also equal. The respective gate voltage of each transistor 48 and 77 is equal to $V_{TN} V_{ON}$, where $V_{TN}$ is the NMOS threshold voltage and $V_{ON}$ is the turn-on voltage. The sources of the transistor 74 and the control transistor 63 are at the same potential. Further, the gates of transistors 74 and 63 are tied together and at the same potential, which is $2*(V+V_{ON})$.

In the absence of an offset voltage or an input signal, the source and drain of the control transistor 63 are at the same voltage. This means that the control transistor 63 is in triode mode, and the control transistor 63, therefore, forms a resistor while the amplifier circuit 60 is in a quiescent state. The resistance value of the control transistor 63 in such state is $1/g_{m63}$, where $g_{m63}$ is the transconductance of the control transistor 63. Thus, for small input signals such that the control transistor 63 remains in the triode mode, the gain of the amplifier circuit 60 is $(\frac{1}{2}) (g_{m44}/g_{m63})$, where $g_{m44}$ is the transconductance of the differential input transistor 44. Such ratio and, hence, the gain of the amplifier circuit 60 when the control transistor 63 is in the triode mode can be set arbitrarily low. With a low gain for small input signals, the input offset voltage only has a small influence on the gate of the output transistor 52, so that it has only a small influence on the quiescent current of the output stage 29.

As the input signal increases, the voltage at the source of the control transistor 63 drops, while the drain of the control transistor 63 rises. Once the input signal becomes large enough, the control transistor 63 leaves the triode region and saturates. At this point, the impedance of the control transistor 63 rises dramatically until it approaches that of the current mirror transistor 49. So, for large input signals, the gain of the amplifier circuit 60 is approximately $g_{m44}/(g_{ds44}+3g_{ds63})$, where $g_{ds44}$ is the drain-to-source conductance of the transistor 44, and where $g_{ds63}$ is the drain-to-source conductance of the transistor 63, and a strong gate drive signal is passed on to the output transistor 52. Note that in the exemplary embodiment shown by FIG. 4, $g_{ds63}=g_{ds49}=1/r_{ds63}$, where $r_{ds63}$ is the drain-to-source resistance of the transistor 63. Thus, the amplifier circuit 60 has a relatively small gain for small input signals, but a large input signal saturates the control transistor 63 allowing for a relatively large gain for the amplifier circuit 60.

In one exemplary embodiment, the values of the components are selected such that the control transistors 63 and 65 operate in the triode mode when the amplifier circuit 60 is in a quiescent state. In such state, the control transistors 63 and 65 function as resistors keeping the gain of the amplifier circuit 60 low. The control transistors 63 and 65 are configured to saturate when the amplifier circuit 60 transitions from the quiescent state to a non-quiescent state. In particular, the control transistors 63 and 65 saturate in response to an input signal applied across the connections 23 and 24. Saturation of the control transistors 63 and 65 allows the gain of the amplifier circuit 60 to significantly increase relative to the circuit's gain in the quiescent state.

Moreover, by reducing the gain of the amplifier circuit 60 in the quiescent state, the control transistors 63 and 65 help to stabilize the output quiescent current. However, when a relatively large input signal is received by the circuit 60, the control transistors 63 and 65 saturate such that the gain of the amplifier circuit 60 is substantially unaffected by the control transistors 63 and 65. Accordingly, the control transistors 63 and 65 help to control the quiescent current such that better quiescent current characteristics are achieved without significantly sacrificing performance.

The invention claimed is:

1. A power amplifier, comprising:
   an input stage configured to receive a differential input signal;
   a current mirror stage coupled to the input stage;
   an output stage coupled to the current mirror stage and to the input stage; and
   a control transistor coupled to the input stage, the current mirror stage, and the output stage, the control transistor configured to operate in a triode mode when the power amplifier is in a quiescent state such that the control transistor forms a resistor thereby reducing a gain of the power amplifier, the control transistor further configured to saturate when the power amplifier is in a non-quiescent state such that the gain of the power amplifier increases in response to the differential input signal relative to the gain of the power amplifier in the quiescent state.

2. A power amplifier, comprising:
   an input stage configured to receive a differential input signal, wherein the input stage comprises a differential input pair of transistors comprising a first input transistor and a second input transistor;
   a current mirror stage coupled to the input stage, wherein the current mirror stage comprises a first current mirror transistor and a second current mirror transistor, wherein the first current mirror transistor has a drain and a gate coupled to a drain of the first input transistor, and wherein the second current mirror transistor has a drain coupled to a drain of the second input transistor;
   an output stage coupled to the current mirror stage and to the input stage; and
   a control transistor coupled to the input stage, the current mirror stage, and the output stage, the control transistor configured to operate in a triode mode when the power amplifier is in a quiescent state such that the control transistor forms a resistor thereby reducing a gain of the power amplifier, the control transistor further configured to saturate when the power amplifier is in a non-quiescent state thereby allowing the gain of the power amplifier to increase relative to the gain of the power amplifier in the quiescent state, wherein a source of the control transistor is coupled to the gate of the first current mirror transistor and a gate of the second current mirror transistor.

3. The power amplifier of claim 2, wherein a drain of the control transistor is coupled to the drain of the second input transistor.

4. The power amplifier of claim 3, further comprising a gate control element coupled to a gate of the control transistor.

5. The power amplifier of claim 4, wherein the gate control element comprises a first gate control transistor and a second gate control transistor, wherein the first gate control transistor has a source coupled to a drain of the second gate control transistor, wherein the second gate control transistor has a source coupled to a source of the first current mirror transistor.

6. The power amplifier of claim 5, wherein the gate of the control transistor is coupled to a gate and a drain of the first gate control transistor.

7. The power amplifier of claim 6, further comprising a current source coupled to the gate and the drain of the first gate control transistor.

8. The power amplifier of claim 2, wherein the gain of the power amplifier in the quiescent state is equal to $(\frac{1}{2})(g_{m1}/g_{m2})$, where $g_{m1}$ is a transconductance of the first input transistor and $g_{m2}$ is a transconductance of the control transistor.

9. The power amplifier of claim 8, wherein the gain of the power amplifier in the non-quiescent state is equal to $g_{m1}/(g_{ds1}+3g_{ds2})$, where $g_{ds1}$ is a drain-to-source conductance of the first input transistor, and where $g_{ds2}$ is a drain-to-source conductance of the control transistor.

10. A method, comprising the steps of:
    reducing a gain of a power amplifier while the power amplifier is in a quiescent state, the power amplifier having a control transistor, the control transistor having a source and a drain coupled to an input stage and a current mirror stage of the power amplifier, wherein the reducing step comprises the step of operating the control transistor in a triode mode when the power amplifier is in the quiescent state such that the control transistor forms a resistor;
    receiving an input signal via the input stage; and
    saturating the control transistor in response to the input signal such that the gain of the power amplifier is increased.

11. The method of claim 10, wherein the source of the control transistor is coupled to gates of a pair of transistors of the current mirror stage.

12. The method of claim 10, wherein the saturating step is performed when the power amplifier transitions from the quiescent state to a non-quiescent state.

13. The power amplifier of claim 1, wherein the control transistor is configured to saturate when the power amplifier transitions from the quiescent state to the non-quiescent state.

14. The power amplifier of claim 1, wherein the control transistor has a drain coupled to a transistor of the current mirror stage.

15. The power amplifier of claim 1, wherein the input stage comprises a differential input pair of transistors comprising a first input transistor and a second input transistor, wherein the current mirror stage comprises a first current mirror transistor and a second current mirror transistor, wherein the control transistor has a source coupled between the first input transistor and the first current mirror transistor, and wherein the control transistor has a drain coupled between the second input transistor and the second current mirror transistor.

16. The power amplifier of claim 15, wherein a voltage difference between the source and the drain increases as a voltage of the differential input signal increases until the control transistor saturates.

* * * * *